(12) United States Patent
Lee et al.

(10) Patent No.: US 7,737,772 B2
(45) Date of Patent: Jun. 15, 2010

(54) BANDWIDTH-ADJUSTABLE FILTER

(75) Inventors: Chao-Cheng Lee, Hsin-Chu (TW); Ying-Yao Lin, Chubei (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/381,548

(22) Filed: May 4, 2006

(65) Prior Publication Data

US 2006/0250181 A1 Nov. 9, 2006
US 2010/0060348 A9 Mar. 11, 2010

Related U.S. Application Data

(63) Continuation-in-part of application No. 11/148,132, filed on Jun. 8, 2005, now Pat. No. 7,102,441, which is a continuation-in-part of application No. 10/748,667, filed on Dec. 31, 2003, now Pat. No. 7,138,869.

(30) Foreign Application Priority Data

Jun. 14, 2004 (TW) ............................ 93117032 A
May 4, 2005 (TW) ............................ 94114457 A

(51) Int. Cl.
*H03K 5/00* (2006.01)
(52) U.S. Cl. .................................. 327/553; 327/552
(58) Field of Classification Search .......... 327/552–554
See application file for complete search history.

(56) References Cited

U.S. PATENT DOCUMENTS

| 3,735,393 A | 5/1973 | Carbrey |
| 3,863,200 A | 1/1975 | Miller |
| 3,863,201 A | 1/1975 | Briggs et al. |
| 4,037,170 A | 7/1977 | Richards |
| 4,484,295 A | 11/1984 | Bedard et al. |
| 5,201,009 A | 4/1993 | Yamada et al. |
| 5,231,627 A | 7/1993 | Paul et al. |
| 5,408,199 A | 4/1995 | Nagano et al. |
| 5,455,582 A * | 10/1995 | Valdenaire .................. 341/154 |
| 5,525,985 A | 6/1996 | Schlotterer et al. |
| 5,535,985 A | 7/1996 | Larbuisson |
| 5,604,927 A | 2/1997 | Moore |
| 5,917,387 A | 6/1999 | Rice et al. |
| 5,999,052 A | 12/1999 | Tang |
| 6,127,893 A * | 10/2000 | Llewellyn et al. ........... 330/284 |
| 6,175,278 B1 | 1/2001 | Hasegawa |
| 6,344,780 B1 * | 2/2002 | Dobashi et al. ............ 333/17.3 |
| 6,545,534 B1 * | 4/2003 | Mehr .......................... 330/69 |
| 6,693,491 B1 * | 2/2004 | Delano ....................... 330/282 |
| 6,703,682 B2 | 3/2004 | Aswell |
| 6,731,160 B1 | 5/2004 | Behzad |
| 7,057,451 B2 * | 6/2006 | Lou et al. ................... 327/553 |

(Continued)

*Primary Examiner*—Lincoln Donovan
*Assistant Examiner*—Patrick O'Neill
(74) *Attorney, Agent, or Firm*—Thomas, Kayden, Horstemeyer & Risley

(57) ABSTRACT

A bandwidth-adjustable filter includes an operational amplifier, a first resistor, a first capacitor and a first resistor ladder circuit. The operational amplifier has a negative input terminal and a positive input terminal. The first resistor is coupled to one of the input terminals of the operational amplifier. The first capacitor is coupled to the first resistor. The first resistor ladder circuit is coupled in parallel to the first resistor for changing the resistance of the first resistor so as to adjust the bandwidth of the filter.

15 Claims, 5 Drawing Sheets

U.S. PATENT DOCUMENTS

| | | |
|---|---|---|
| 7,102,441 B2 | 9/2006 | Lee et al. |
| 7,138,869 B2 * | 11/2006 | Lee et al. ................... 330/282 |
| 7,239,196 B2 * | 7/2007 | Hasegawa ................... 327/552 |
| 2004/0232981 A1 * | 11/2004 | Lee et al. ...................... 330/86 |
| 2005/0008107 A1 * | 1/2005 | Brown ........................ 375/343 |

* cited by examiner

BANDWIDTH-ADJUSTABLE FILTER

This application claims the benefit of Taiwan application Serial No. 94114457, filed May 4, 2005. This application is also a continuation-in-part of U.S. application Ser. No. 11/148,132, filed Jun. 8, 2005 (now U.S. Pat. No. 7,102,441), which is a continuation-in-part of U.S. application Ser. No. 10/748,667, filed Dec. 31, 2003, now U.S. Pat. No. 7,138,869 the subject matter of application Ser. No. 11/148,132 is incorporated herein by reference.

BACKGROUND OF THE INVENTION

1. Field of the Invention

The invention relates in general to a filter, and more particularly to a bandwidth-adjustable filter.

2. Description of the Related Art

In wireless communication systems, according to a common modulation mechanism, when in-phase signals (I-channel) and quadrature-phase signals (Q-channel) have different 3 dB bandwidth ($\omega_0$) in the filter, these two kinds of signals cannot match in phase. When the signals in the I-channel and in the Q-channel have a phase difference not equal to 90 degrees, the signal constellation is distorted and the bit error rate is thus increased. Therefore, in order to maintain system stability, it is very important that the filter has accurate 3dB bandwidth.

Referring to FIG. 1, a schematic diagram of a filter disposed in a wireless communication system is shown. The filter 100 has a closed-loop gain $H_0$ equal to $-R3/R2$, and has a 3 dB frequency $\omega_0$ represented by $$\omega_0 = \frac{1}{\sqrt{R1 \times R3 \times C2 \times C1}} \quad \text{Eq. 1}$$

When the gain $H_0$ is $-1$, Eq.1 can be represented by $$\omega_0 = \frac{1}{\sqrt{m \times n} \times R \times C} \quad \text{Eq. 2}$$

wherein $R1 = mR$, $R2 = R$, $C1 = C$, $C2 = nC$.

As shown in Eq. 2, by selecting suitable values R and C, the 3 dB frequency $\omega_0$ can reach the expected value. In the modulation mechanism of FIG. 1, a capacitive array method is used to achieve the modulation of 3 dB frequency by adjusting the valid capacitance C. However, the conventional modulation mechanism has a minimum adjustable scale only about 2~3%, which cannot meet the requirement of high accuracy for the wireless communication system.

SUMMARY OF THE INVENTION

It is therefore an object of the invention to provide a filter. The adjustable bandwidth of the filter can have a higher resolution.

The invention achieves the above-identified object by providing a filter including an operational amplifier, a first resistor device and a first capacitor. The operational amplifier has a first input terminal, a second input terminal and an output terminal. The first resistor device is coupled to the first input terminal of the operational amplifier. The first capacitor is coupled to the first resistor device and the output terminal of the operational amplifier. The first resistor device has an equivalent resistance and includes a resistor ladder circuit, and the equivalent resistance corresponds to the resistor ladder circuit. The bandwidth of the filtering device corresponds to the equivalent resistance of the first resistor device and capacitance of the first capacitor.

Preferably, the resistor ladder circuit of the filtering device includes first switches and second switches for changing the resistance of the resistor ladder circuit so as to adjust the bandwidth of the filtering device.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
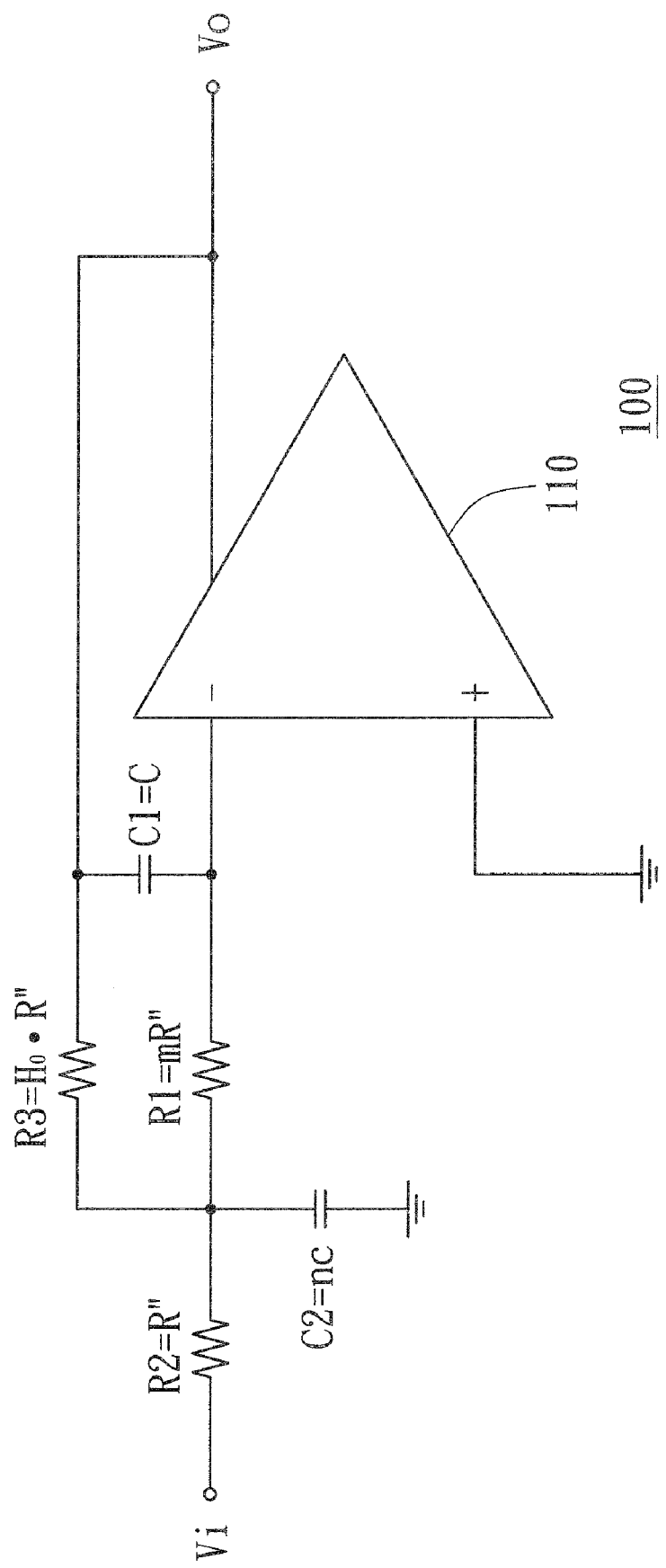
FIG. 1 (Prior Art) is a schematic diagram of a filter disposed in a wireless communication system
Figure 2:
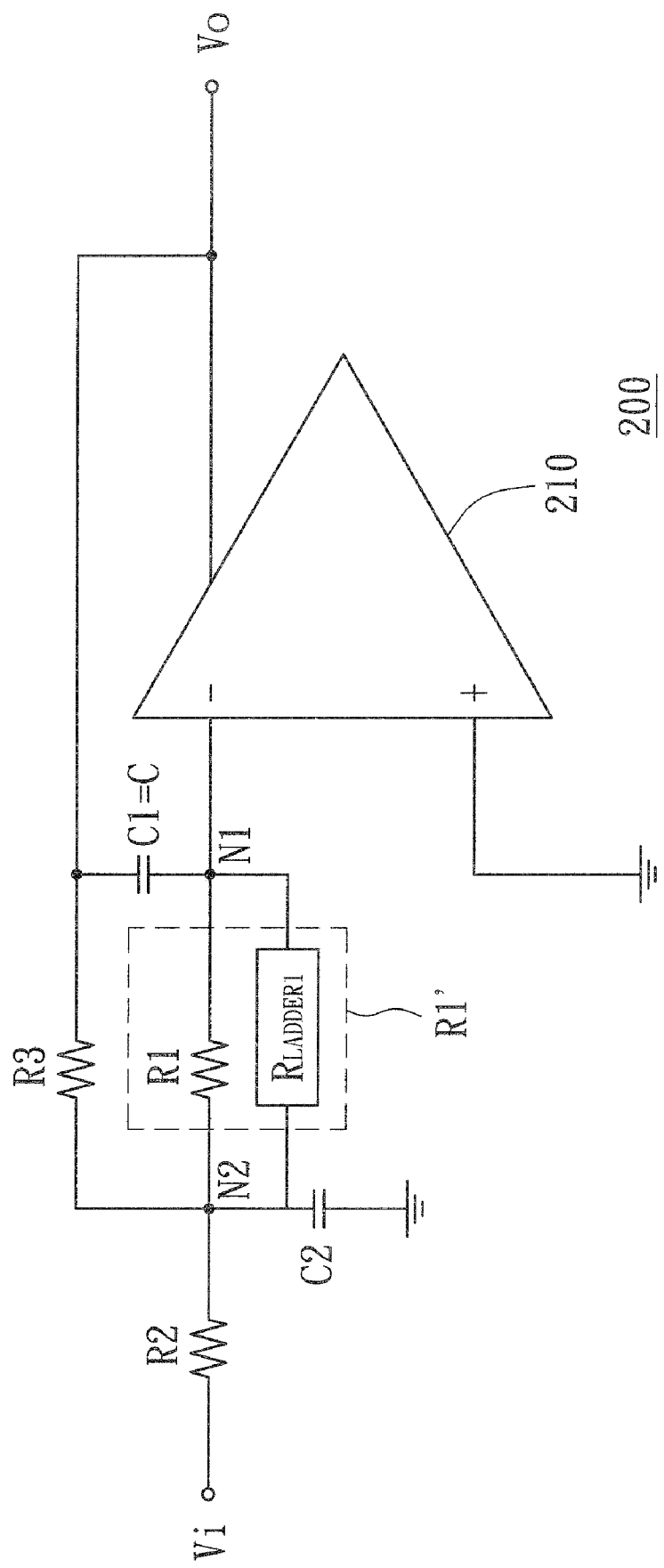
FIG. 2 is a circuit diagram of a bandwidth-adjustable filter according to a preferred embodiment of the invention.

Referring to FIG. 2, a circuit diagram of a bandwidth-adjustable filter according to a preferred embodiment of the invention is shown. The filter 200 includes an operational amplifier 210. The operational amplifier 210 has a negative input terminal and a positive input terminal coupled to the ground. The operational amplifier 210 is a single-input-terminal amplifier preferably. The filter 200 further includes a first adjustable resistor R1', a first capacitor C1, a second capacitor C2, a second resistor R2 and a third resistor R3. The adjustable resistor R1' has a first terminal defined as a node N1 and a second terminal defined as a node N2. The first terminal of the first adjustable resistor R1' is coupled to the negative input terminal of the operational amplifier 210. The first capacitor C1 has a first terminal coupled to the node N1 and a second terminal coupled to the output terminal of the operational amplifier 210. The second capacitor C2 has a first terminal grounded and a second terminal coupled to the node N2. The second resistor R2 is coupled to the node N2, and the third resistor R3 is coupled between the node N2 and the output terminal of the operational amplifier 210, wherein the output terminal is for outputting an output voltage $V_0$.

As shown in Eq. 2, the 3 dB frequency $\omega_0$ of the filter 200 in FIG. 2 can be represented by $$\omega_0 = \frac{1}{\sqrt{m' \times n} \times R \times C} \quad \text{Eq. 3}$$

wherein $R1' = m' \times R$, $R2 = R$, $C1 = C$, $C2 = n \times C$.

From Eq. 3, it can be known that the 3 dB frequency $\omega_0$ of the filter 200 can be effectively controlled by adjusting the first adjustable resistor R1'. In the embodiment, a resistor ladder circuit $R_{LADDER1}$ is used to finely adjust the value of the first adjustable resistor R1' so as to achieve the purpose of controlling the 3dB frequency $\omega_0$ accurately. In the embodiment, the first adjustable resistor R1' includes the resistor ladder circuit $R_{LADDER1}$ coupled in parallel to a first resistor R1. The resistor ladder circuit $R_{LADDER1}$ has one terminal coupled to the node N2 and the other terminal coupled to the node N1.

Figure 3:
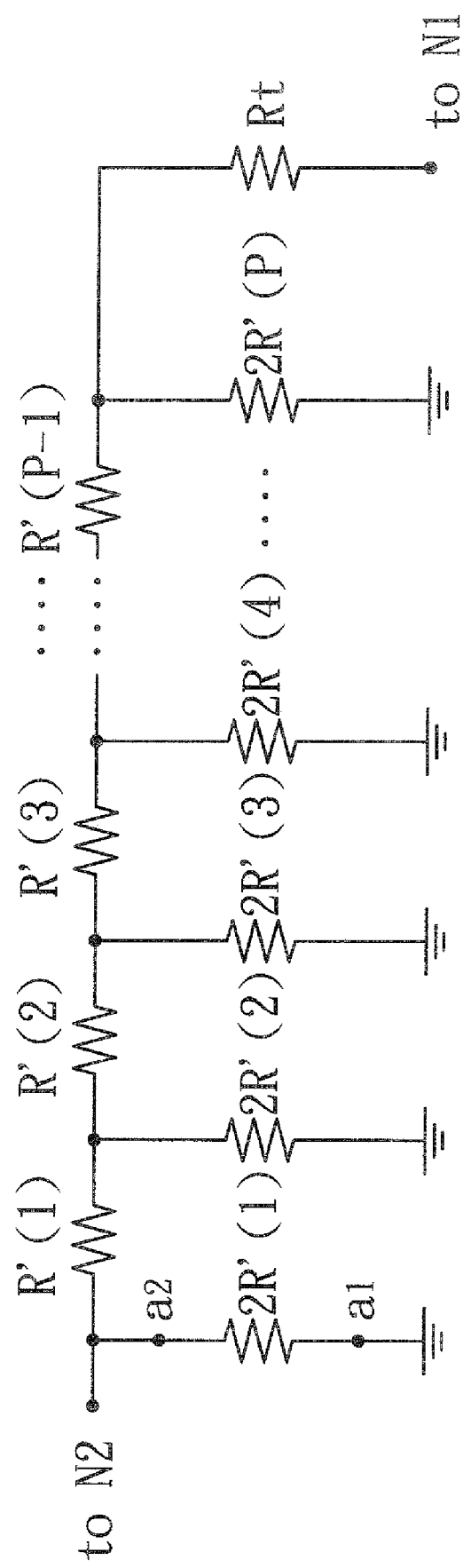
FIG. 3 is a circuit diagram of a resistor ladder circuit according to a preferred embodiment of the invention.

Referring to FIG. 3, a circuit diagram of a resistor ladder circuit $R_{LADDER1}$ according to a preferred embodiment of the invention is shown. In the embodiment, the resistor ladder circuit $R_{LADDER1}$ is an R–2R resistor ladder circuit $(R-2R)_1$, and the R–2R resistor ladder circuit (R–2R), includes a plurality of second resistors 2R', first resistors R' and third resistors Rt. The resistance of the second resistor 2R' is preferably twice of the resistance of the first resistor R'. The second resistors are denoted sequentially by the second resistor 2R'(1)~2R'(P), wherein P is a positive integer. Each of the second resistors 2R' has a first terminal a1 grounded. The second terminals a2 of the second resistor 2R'(1) and the first resistor R'(1) are coupled to the node N2. The first resistors are denoted sequentially by R'(1)~R'(P–1). Each of the first resistor R' is coupled between the second terminals a2 of the two corresponding adjacent second resistors 2R'. The third resistor Rt has a first terminal coupled to the second terminal a2 of the second resistor 2R'(P) and a second terminal coupled to the node N1. The third resistor Rt and the second resistor 2R' have substantially the same resistance preferably.

The second resistors 2R'(1)~2R'(P) are arranged respectively in correspondence to the first resistors R'(1)~R'(P–1) and the third resistor Rt. Each of the second resistors 2R'combined with the corresponding first resistor R' is called a resistor pair. For example, the second resistor 2R'(i) and the first resistor R'(i) form a resistor pair, wherein 0<i<P, and the second resistor 2R'(P) and the third resistor Rt form a resistor pair. The equivalent resistance of the R–2R resistor ladder circuit is $2^P \times R'$.

If the first resistor R1 of the first adjustable resistor R1' is m×R, and the equivalent resistance of the R–2R resistor ladder circuit is $2^P \times R$, the equivalent resistance of the first adjustable resistor R1' can be obtained by the following formulation.

$$R1' = m' \times R = m \times R // 2^P \times R = \left(m - \frac{m^2}{2^P + m}\right) \times R,$$

$$\text{and } m' = \left(m - \frac{m^2}{2^P + m}\right)$$

Therefore, the equivalent resistance of the first adjustable resistor R1' can be adjusted by increasing or decreasing the number of resistor pairs, i.e. the P value.

Figure 4:
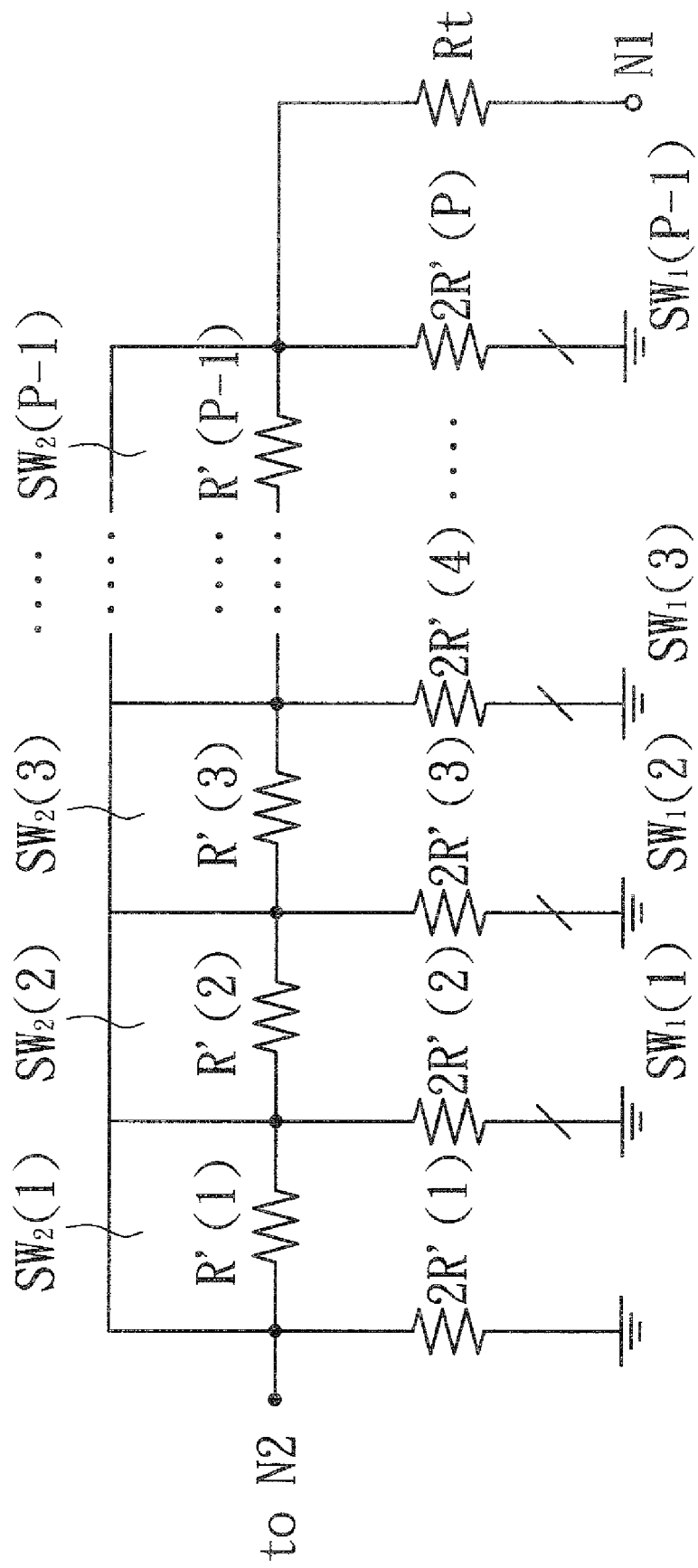
FIG. 4 is a diagram of a resistor ladder circuit configured with switches.

Another method for adjusting the resistance of the resistor ladder circuit is referred to FIG. 4, which shows a resistor ladder circuit ($R_{LADDER1}$) configured with switches. In the embodiment, the resistor ladder circuit ($R_{LADDER1}$) is an R–2R resistor ladder circuit $(R-2R)_1$, the R–2R resistor ladder circuit $(R-2R)_1$ includes a plurality of first switches, which are sequentially denoted by $SW_1(1)$~$SW_1(P)$, and a plurality of second switches, which are sequentially denoted by $SW_2(1)$~$SW_2(P)$. The switch $SW_1(1)$, ..., or $SW_1(P)$ is coupled between the corresponding second resistor 2R' and a ground voltage. The switches $SW_2(1)$~$SW_2(P)$ are coupled in parallel to the corresponding first resistors R'.

In practical operation, the first switches and the second switches are complementary. That is, taking R'(1) and 2R'(1) as an example, when the first switch $SW_1(1)$ is closed such that a current flows by the resistor 2R'(1), the corresponding second switch $SW_2(2)$ is open. In other words, when the first switch $SW_1(1)$ is open, the corresponding first resistor R'(1) is open relative to the ground voltage, and when the second switch $SW_2(1)$ is closed, the corresponding first resistor R'(1) is short-cut. Therefore, the bit resolution of the R–2R resistor ladder circuit $(R-2R)_1$ can be adjusted through the first switches $SW_1$ and the second switches $SW_2$. The effect that P is equal to K can be achieved by turning on K first switches and turning off the corresponding K second switches. Accordingly, P=6 when all the first $SW_1$ are turned on and the second switches are turned off in the R–2R resistor ladder circuit, and P=4 when two of the first switches $SW_1$ are turned off and the two corresponding second switches are closed.

The larger the P value is, the more accurately the 3 dB bandwidth of the filter can be adjusted. In a practical experiment, the 7 stage (p=7) R–2R resistor ladder circuit can have 0.88% resolution, that is, a 0.88% fine-tuning scale. Therefore, the method of the invention can be applied to an I/Q signal application having low error tolerance. Each of the first switches $SW_1$ and the second switches $SW_2$ receives a control signal outputted by a control logic circuit (not shown in the figure). In one embodiment, the control logic circuit generates the required control signal in a calibration mode, and outputs the control signal in a normal mode.

Besides, when the filter has two stages of amplifiers, the two stages of amplifiers can be selected to have the same R and C values (referring to Eq. 4) such that the 3 dB bandwidth of the two stages of amplifiers is maintained the same. However, when there exists uncontrollable deviation in manufacturing process, the capacitors C of the two stages of amplifiers cannot match. Under this situation, the resistor ladder circuit can be disposed in the second stage of amplifier and the 3 dB bandwidth $\omega_0$ in the first-stage and the second-stage amplifiers can be adjusted to be nearly equal by changing the resistance of the resistor ladder circuit.

Figure 5:
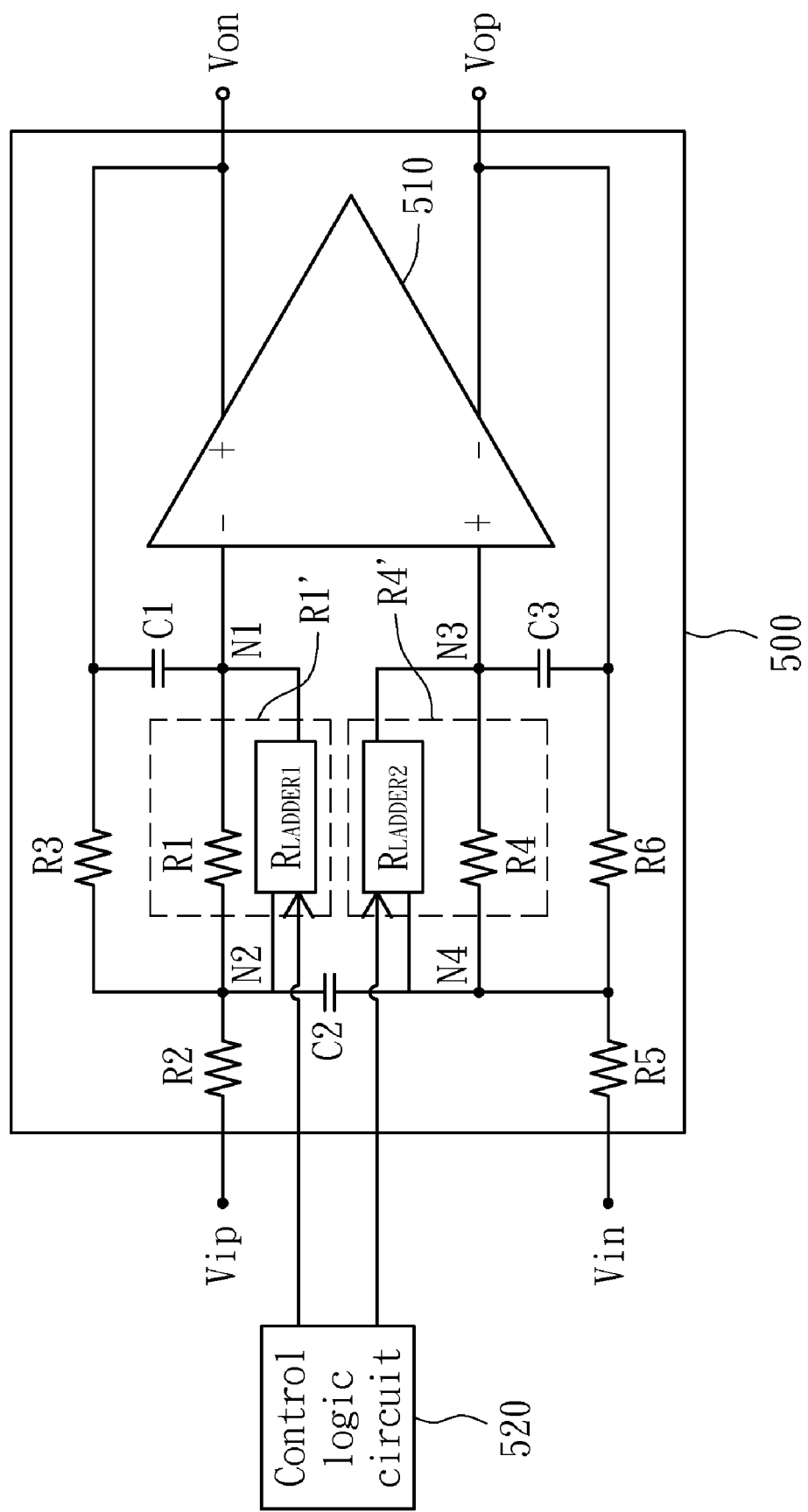
FIG. 5 is a circuit diagram of a bandwidth adjustable filter according to another preferred embodiment of the invention.

Referring to FIG. 5, a circuit diagram of a bandwidth adjustable filter according to another preferred embodiment of the invention is shown. The filter in this embodiment is applied to a differential signal system. The operational amplifier 210 is a differential amplifier 510. In a calibration mode, the control logic circuit 520 obtains the difference of the 3 dB bandwidth ($\omega_0$) of signals transmitted at I/Q (in-phase/ quadrature-phase) channels of the filtering device 500. In a normal mode, the control logic circuit 520 outputs the control signal to control the resistor ladder circuit $R_{LADDER1}$, or $R_{LADDER2}$, or both at the same time such that the I-channel and Q-channel signals of the filtering device 500 have substantially the same 3 dB bandwidth ($\omega_0$). In this way, the minimum scale of bandwidth modulation in the filtering device of the invention is smaller than that of the prior-art filter.

According to the above-mentioned embodiments of the invention, a low-pass filter structure is taken as an example for illustrating the operation of the operational amplifier. However, the operational amplifier can also be disposed in inverting/non-inverting configuration through a high-pass filter or a band-pass filter structure. As long as the filter can improve the modulation resolution of the 3 dB bandwidth by changing the equivalent resistance of the resistor ladder circuit, all these decorations are not apart from the scope of the invention.

While the invention has been described by way of example and in terms of two preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A filtering device, comprising:
   an operational amplifier, having a first input, a second input and an output;
   a first resistor device, coupled to the first input of the operational amplifier; and
   a first capacitor, coupled to the first resistor device and the output of the operational amplifier;
   wherein the first resistor device has an equivalent resistance and includes a resistor ladder circuit, and the equivalent resistance corresponds to the resistor ladder circuit;
   wherein the bandwidth of the filtering device corresponds to the equivalent resistance of the first resistor device and capacitance of the first capacitor;
   wherein the bandwidth of the filtering device can be adjusted by changing a stage number of the resistor ladder circuit; and
   wherein the resistor ladder circuit is an R-2R resistor ladder circuit.

2. The filtering device according to claim 1, further comprising:
   a second capacitor, having one terminal grounded and the other terminal coupled to the first resistor device;
   a second resistor device, coupled to the first resistor device and the second capacitor; and
   a third resistor device, having one terminal coupled to the first resistor device and the second capacitor, and the other terminal coupled to the output of the operational amplifier.

3. The filtering device according to claim 1, wherein the resistor ladder circuit comprises:
   a plurality of second resistors, each of the second resistors having a first terminal grounded;
   a plurality of first resistors, coupled to second terminals of the second resistors; and
   a third resistor, coupled in series to the last one of the first resistors.

4. The filtering device according to claim 3, wherein the resistance of each of the second resistors is substantially twice of the resistance of each of the first resistors.

5. The filtering device according to claim 3, wherein the resistor ladder circuit further comprises:
   a plurality of first switches, coupled between the second resistors and a ground; and
   a plurality of second switches, respectively coupled in parallel to the first resistors;
   wherein the first switches and the second switches are complementary.

6. The filtering device according to claim 5, wherein the bandwidth of the filtering device is adjusted by controlling the first switches and the second switches.

7. The filtering device according to claim 1, wherein the bandwidth modulation of the filtering device has a minimum scale smaller than 3%.

8. The filtering device according to claim 1, wherein the bandwidth of the filtering device is adjusted by changing the equivalent resistance of the first resistor device.

9. A filtering device, comprising:
   a differential amplifier, having a first input, a second input, a first output and a second output;
   a first resistor device, coupled to the first input of the differential amplifier;
   a second resistor device, coupled to the second input of the differential amplifier;
   a first capacitor, coupled to the first resistor device;
   a second capacitor, coupled to the second resistor device; and
   wherein the first resistor device has an equivalent resistance and includes a first resistor ladder circuit, and the equivalent resistance corresponds to the first resistor ladder circuit, and wherein the first resistor ladder circuit comprises:
      a plurality of second resistors, each of the second resistors having a first terminal grounded;
      a plurality of first resistors, respectively coupled to second terminals of the second resistors;
      a third resistor, coupled in series to the last one of the first resistors;
      a plurality of first switches, coupled between the second resistors and a ground; and
      a plurality of second switches, coupled in parallel to the first resistors;
      wherein the first switches and the second switches are complementary;
   wherein by adjusting the first resistor ladder circuit, the multiplication of the equivalent resistance of the first resistor device and the capacitance of the first capacitor is substantially the same as the multiplication of the resistance of the second resistor device and the capacitance of the second capacitor;
   wherein the bandwidth of the filtering device is adjusted by changing a stage number of the first resistor ladder circuit.

10. The filtering device according to claim 9, wherein the first resistor ladder circuit is an R-2R resistor ladder circuit.

11. The filtering device according to claim 9, wherein the bandwidth of the filtering device is adjusted by controlling the first switches and the second switches.

12. The filtering device according to claim 9, wherein the bandwidth modulation of the filtering device has a minimum scale smaller than 3%.

13. The filtering device according to claim 9, wherein the second resistor device includes a second resistor ladder circuit.

14. The filtering device according to claim 9, wherein the bandwidth of the filtering device is adjusted by changing the equivalent resistance of the first resistor device.

15. The filtering device according to claim 9, wherein the first capacitor is connected to the first resistor device and the second capacitor is connected to the second resistor device.

* * * * *